United States Patent

Robinson et al.

[11] Patent Number: 5,711,991
[45] Date of Patent: Jan. 27, 1998

[54] PROCESS FOR MAKING LITHOGRAPHIC SHEET MATERIAL HAVING A THERMOPLASTIC ADHESIVE LAYER

[75] Inventors: Edward C. Robinson, New Kensington; Robert E. Bombalski, Brackenridge; Jean Ann Skiles, Gibsonia; Thomas L. Levendusky, Greensburg; Mark L. Weaver, Allison Park, all of Pa.

[73] Assignee: Aluminum Company of America, Pittsburgh, Pa.

[21] Appl. No.: 559,670

[22] Filed: Nov. 20, 1995

[51] Int. Cl.$^6$ .............. B05D 1/36; B05D 3/02; B41N 1/08
[52] U.S. Cl. .............. 427/202; 427/203; 427/205; 427/375; 427/385.5; 101/458
[58] Field of Search .............. 430/49; 101/457–459; 427/202, 203, 205, 375, 385.5, 180, 208.2

[56] References Cited

U.S. PATENT DOCUMENTS

| | | | |
|---|---|---|---|
| 3,060,024 | 10/1962 | Burg et al. | |
| 3,871,881 | 3/1975 | Mikelsons | 430/60 |
| 3,975,197 | 8/1976 | Mikelsons | 430/525 |
| 4,098,188 | 7/1978 | Stroszynski | 101/458 |
| 4,289,071 | 9/1981 | Hallman et al. | 101/395 |
| 4,425,382 | 1/1984 | Tajima | 427/203 |
| 4,456,670 | 6/1984 | Nakayama et al. | 430/49 |
| 4,507,383 | 3/1985 | Tsuruta et al. | 430/275.1 |
| 5,304,443 | 4/1994 | Figov | 430/49 |
| 5,407,702 | 4/1995 | Smith et al. | 427/211 |

FOREIGN PATENT DOCUMENTS 645611  1/1989  Japan .

*Primary Examiner*—Shrive Beck
*Assistant Examiner*—Fred J. Parker
*Attorney, Agent, or Firm*—Glenn E. Klepac

[57] ABSTRACT

A process for making lithographic sheet material. A metal sheet substrate is coated with a thermoplastic adhesive layer, and a particle layer is adhered to and within the adhesive layer while it is near its melting point. The adhesive layer is preferably polyethylene terephthalate and the particle layer preferably contains alumina particles.

19 Claims, No Drawings

PROCESS FOR MAKING LITHOGRAPHIC SHEET MATERIAL HAVING A THERMOPLASTIC ADHESIVE LAYER

FIELD OF THE INVENTION

The present invention relates to lithographic sheet material that is coated with a photosensitive "resist" composition. The coated material is used for offset printing.

BACKGROUND OF THE INVENTION

Lithographic sheet material in commercial use nowadays typically comprises an aluminum alloy substrate that must be grained and anodized before it is coated with a photosensitive layer. "Graining" refers to a mechanical or chemical process for roughening the aluminum sheet surface. The process results in a substrate surface having a uniform coarse texture that will provide adequate resolution in the prints to be made, while lasting through thousands of printings before the sheet must be replaced in a printing press. Anodizing the grained sheet then provides a desired microstructure on the aluminum surface for print durability.

Although grained and anodized lithographic sheet material performs adequately, it is difficult and expensive to produce. Mechanical graining requires the use of an abrasive slurry and brushes with operations controls necessary to account for brush wear. Chemical graining requires treatment with strong basic or acidic etching solutions which are difficult to dispose of properly. Anodizing requires expenditures of large amounts of electrical energy in its operation and also generates effluents that must be carefully handled to avoid environmental problems. Electrochemical graining and anodizing require expenditures of large amounts of electrical energy. Graining and anodizing also generate effluents that must be handled carefully to avoid environmental problems. Because of difficulties inherent in the prior art graining and anodizing processes, persons skilled in the art have come to recognize that it would be desirable to eliminate both graining and anodizing in the commercial production of lithographic sheet material. However, no completely desirable alternative was developed prior to the present invention.

A principal objective of the present invention is to provide a lithographic sheet material and a process for its production which avoid the graining and anodizing steps conventionally utilized for making lithographic sheet.

A related objective of the invention is to provide a lithographic sheet production process that minimizes incidental generation of waste material requiring disposal.

A further objective of the invention is to provide a lithographic sheet material that can be manufactured economically, using readily available and environmentally acceptable starting materials.

Additional objectives and advantages of our invention will become apparent to persons skilled in the art from the following detailed description.

SUMMARY OF THE INVENTION

In accordance with the invention, there is provided a lithographic sheet material comprising a substrate coated with a thermoplastic adhesive layer, and a coating of mineral or metal particles adhered to the thermoplastic adhesive layer.

The substrate may be metal or polymer and is preferably an aluminum alloy or steel. Some suitable polymer substrates include polyesters, polyolefins, acrylics, polyamides, polycarbonates and polyvinyl chlorides. Some suitable aluminum alloys include alloys of the AA1000, 3000 and 5000 series. Aluminum alloys of the AA5000 series containing about 0.5–10 wt. % magnesium are particularly preferred. The substrate should have a thickness of about 5–30 mils, preferably about 8–20 mils. An AA5182-H19 aluminum alloy substrate having a thickness of about 8.8 mils was utilized in a preferred embodiment.

The thermoplastic adhesive layer is preferably a polyester, polyolefin, polycarbonate, a polyamide or polyvinyl chloride. Polyesters are preferred, and polyethylene terephthalate (PET) is utilized in a preferred embodiment wherein the substrate is an aluminum alloy.

A preferred polyester resin is a high melt viscosity (HMV) resin of the type which has heretofore been used to coat ovenable metal trays and food packaging foils. Selar(R) PT8307HMV copolymer resin sold by E.I. DuPont de Nemours Company is an example of a high performance polyester resin suitable for use in the present invention. Such copolymer can be blended with other thermoplastic polyesters. For example, a blend of Selar(R) PT8307HMV copolymer with T89 PET sold by Hoechst-Celanese may provide satisfactory performance.

The polyethylene terephthalate adhesive layer may be coated onto the substrate by any of several preferred coating means including spraying, roll coating, dipping, electrocoating, powder coating, laminating and extrusion coating. In a particularly preferred embodiment, PET is extrusion coated onto one side of an aluminum alloy substrate at a coating thickness of about 0.5 mil (13 microns). The PET may be extrusion coated onto one or both sides of the substrate and its thickness should be at least about 0.25 mil (6 microns) on each side. When the lithographic sheet material is to be used for offset printing, a thermoplastic adhesive coating of about 0.25–2 mils is preferred.

The adhesive layer is preferably loaded with particles of a white pigment to improve its opacity. Some preferred pigments include titanium dioxide, alumina, calcium carbonate, silicon dioxide, talc and mixtures thereof. The pigment should have an average particle size of about 10 microns or less, preferably about 1 micron or less. The pigment loading should be about 1–20 wt. %, preferably about 2–10 wt. %. A preferred polyethylene terephthalate adhesive layer contains about 5.4 wt. % titanium dioxide particles having an average particle size of about 0.2–0.3 microns.

The pigmented adhesive layer is preferably extrusion coated onto one side of an aluminum alloy sheet by heating the metal sheet, extruding pigmented PET onto one side of the sheet while it is at a temperature of at least about 400° F. (204° C.), heating the coated sheet to at least the glass transition point of the PET, and then cooling the coated sheet. The extrusion die is positioned about 10–200 mm away from the sheet. The sheet travels approximately 10–20 times faster than extrudate issuing from the extrusion die, so that the extrudate is reduced in thickness by pull of the metal sheet. The molten polymer impinges upon the surface of the metal sheet almost immediately after it exits the die, so that it has no opportunity to cool before it is applied. A uniform coating is thereby ensured on the sheet surface.

Additional details of the extrusion coating process of the present invention are revealed in Smith et al. U.S. Pat. No. 5,407,702. The disclosure of said patent is incorporated herein, to the extent consistent with the present invention.

The adhesive layer is reheated to a temperature near its melting point in order to facilitate adherence of particles to the sheet surface. When the adhesive layer is PET having a melting point of about 450° F (232° C.), the coated sheet is preferably heated to about 435°–465° F. and more preferably about 440°–460° F. The adhesive layer is preferably within about 10° F. (6° C.) of its melting point before the particles are applied.

The mineral or metal particles applied to the adhesive layer may be alumina, silica, magnesia, titania, zinc oxide, aluminum or zinc. The particles have an average particle size of less than about 30 microns, preferably about 0.5–20 microns and more preferably about 1–10 microns. Alumina, silica and titania particles are preferred. The alumina particles preferably are in the alpha alumina or transition alumina or monohydrate forms. As used herein, the term "alumina" refers to alpha alumina, alumina monohydrate in various forms, and various transition aluminas containing not more than one $H_2O$ group per $Al_2O_3$ group. In some particularly preferred embodiments, we utilized transition alumina particles having an average size of about 5.0 microns and 6.4 microns, and alpha alumina particles having an average size of about 1.2 microns.

The layer of alumina particles adhered to the sheet surface is next treated with a sealant. An aqueous sodium silicate solution is utilized in a particularly preferred embodiment. Alternatively, the sealant solution may contain a soluble metal salt. Salts of nickel, cobalt, copper, zinc and aluminum may be utilized. Examples of suitable metal salts include nickel acetate and cobalt acetate. The sealant layer provides a desired level of adherence between the alumina particles and the photosensitive layer which is next applied to the sheet.

The sealant treated alumina particle layer is coated with a photosensitive layer, which after exposure to light, followed by development and/or fixing, yields a surface with the desired image to be printed. The photosensitive layer may contain silver halides, but several others are suitable as described in "Light Sensitive Systems" by J. Kosar, J. Wiley & Sons, New York, 1965. Some examples of other suitable photosensitive compounds include colloid layers containing chromates and dichromates; layers containing monomers or prepolymers which can be photopolymerized, usually with the aid of an initiator; layers containing 0-diazaquinones, or condensation products of diazonium salts; and layers containing an inorganic or organic photoconductor. The photosensitive layer is usually applied to the sheet material by a manufacturer of sensitized printing plates. Some chemical influences on the platemaking and printing processes are described in "The Lithographers Manual", C. Shapirod, Graphic Arts Technical Foundation, Pittsburgh, Pa., 1974.

DETAILED DESCRIPTION OF A PREFERRED EMBODIMENT

Six specimens of lithographic sheet material were prepared from AA5182-H19 aluminum alloy sheet having a thickness of about 8.8 mils (224 microns). The specimens were each cleaned with an aqueous alkaline cleaning solution, dried, and then extrusion coated on one side with polyethylene terephthalate (PET) at a thickness of about 0.5 mils (13 microns). The PET coating contained 5.4 wt. % $TiO_2$ particles having an average particle size of about 0.2–0.3 microns.

The six samples were then coated with alumina particles according to the procedures summarized in the Examples reported below. In these Examples, A-10 alumina is a transition alumina having an average particle size of about 6.43 microns; A-14 alumina is a transition alumina having an average particle size of about 5.0 microns; and A-152 alumina is an alpha alumina characterized by an average particle size of about 1.2 micron.

EXAMPLE 1

Sample Size: 6 in.×7.25 in.
Powder coating: A-10 alumina (6.43 microns)
Coating Procedure:
1. Heat powder for 5.0 minutes at an ambient temperature of 435°–500° F.
2. Heat the sheet for 1.0 minute so that the peak metal temperature (PMT) reaches 435°–465° F.
3. Apply powder to the hot coating on the sheet.
4. Heat powder coated sheet for 1.0 minute so that the PMT reaches 435°–465° F.
5. Brush off excess powder from the coated sheet.
6. Apply 80 psig air pressure to remove excess powder.

EXAMPLE 2

Sample Size: 6 in.×9.5 in.
Powder coating: A-14 alumina (5.0 microns)
Coating Procedure:
1. Heat powder for 5.0 minutes at an ambient temperature of 435°–500° F.
2. Remove release paper and heat the sheet for 1.0 minute so that PMT reaches 435°–465° F.
3. Apply powder to the hot coating on the sheet.
4. Heat powder coated sheet for 1.0 minute so that PMT reaches 435°–465° F.
5. Brush off excess powder from the sheet. About 1.0 gram of the powder remained adhered to the polymer surface.
6. Wash the coated sheet with water to remove excess powder.

EXAMPLE 3

Sample Size: 6 in.×9.5 in.
Powder coating: A-14 alumina (5.0 microns)
Coating Procedure:
1. Heat powder for 5.0 minutes at an ambient temperature of 435°–500° F.
2. Heat the sheet for 1.0 minute so that the PMT reaches 435°–465° F.
3. Apply alumina powder to the hot PET coating.
4. Heat powder coated sheet for 1.0 minute so that the PMT reaches 435°–465° F.
5. Brush off excess powder from the sheet.
6. Wash the coated sheet with water to remove the excess powder. About 1.0 gram of the powder remained adhered to the polymer.
7. Wash the coated sheet with a slurry of a coarse polishing compound, and rinse.

EXAMPLE 4

Sample Size: 6 in.×9.5 in.
Powder coating: A-152 alumina (1.2 microns)
Coating Procedure:
1. Heat powder for 5.0 minutes at an ambient temperature of 435°–500° F.
2. Heat the sheet for 1.0 minute so that the PMT reaches 435°–465° F.
3. Apply powder to the hot coating on the sheet.

4. Heat powder coated sheet for 1.0 minute so that the PMT reaches 435°–465° F.
5. Brush off excess powder from the coated sheet. About 0.5 gram of the powder remained adhered to the polymer surface.
6. Wash the coated sheet with water to remove the excess powder.

EXAMPLE 5

Sample Size: 6 in.×9.5 in.
Powder coating: A-14 alumina (5.0 microns)
Coating Procedure:

1. Heat powder for 5.0 minutes at an ambient temperature of 435°–500° F.
2. Heat the sheet for 1.0 minute so that the PMT reaches 435°–465° F.
3. Apply powder to the hot coating on the sheet.
4. Heat powder coated sheet for 1.0 minute so that the PMT reaches 435°–465° F.
5. Brush off excess powder from the coated sheet.
6. Wash the coated sheet with water to remove excess powder. About 1.0 gram of the powder remained adhered to the polymer surface.
7. Wash with an aqueous slurry of a coarse polishing compound, and rinse.

TABLE 1

Physical Properties of Lithographic Sheets

| Sample | Surface Topography[1] | | | Water Wettability | |
|---|---|---|---|---|---|
| | Ra (L) | Ra (T) (microinches) | Ratio (T/L) | Foil Rating[2] | Contact Angle |
| Commercial Plate A | | | | | |
| Nitric Acid Electrochemically grained, Anodized and Post Treated (Sodium Silicate) | 12.1 | 13.6 | 1.12 | A | 3.5° |
| Commercial Plate B | | | | | |
| Hydrochloric Acid Electrochemically Grained, Anodized, and Post Treated (Sodium Silicate) | 11.7 | 13.6 | 1.16 | A | 8.7° |
| Example 1 | 34.1 | 33.3 | 0.98 | A | 109.7° |
| Example 2 | 19.3 | 19.8 | 1.03 | A | 74.0° |
| Example 3 | 27.5 | 23.2 | 0.84 | A | 95.7° |
| Example 4 | 16.5 | 16.7 | 1.01 | A | 81.7° |
| Example 5 | 18.3 | 14.5 | 0.79 | A | 63.3° |

[1]Surface topography measurements were made with a Taylor-Hobson Sutronic 4+ Styplus Profilometer using a 5 μm radiused stylus. Ra is average roughness and is based upon 3 measurements in the transverse (T) and 3 measurements in the longitudinal (L) directions on the sheet.
[2]Foil wettability rating is based upon A to H scale. An A rating is wettability with 100% Deionized water.

Coated sheets processed according to Examples 4–6 were sealed by exposure to an aqueous sodium silicate solution, and dried. A photosensitive layer was coated over the sealed alumina particles. The photosensitive layer was then exposed to light, and the sheet was developed. Satisfactory print quality was obtained in all samples tested.

The foregoing detailed description of our invention has been made with reference to some particularly preferred embodiments. Persons skilled in the art will understand that numerous changes and modifications can be made without departing from the spirit and scope of the following claims.

What is claimed is:

1. A process for making a lithographic sheet material, comprising:

(a) providing a substrate comprising a metal sheet,
   (b) coating said substrate with a an adhesive layer comprising a thermoplastic polymer having a lower melting point than said metal sheet,
   (c) maintaining said adhesive layer at one or more temperatures within about 15° F. above or below its melting point, and
   (d) while maintaining said adhesive layer at said one or more temperatures, adhering to said adhesive layer a particle layer comprising a plurality of particles selected from the group consisting of alumina, silica, zinc oxide, titanium oxide, magnesia, aluminum and zinc, said particles having an average particle size of less than about 30 microns and less than the thickness of said adhesive layer.

2. The process of claim 1, wherein said substrate comprises an aluminum alloy or steel.

3. The process of claim 1, wherein said substrate has a thickness of about 5–30 mils (127–762 microns).

4. The process of claim 1, wherein said substrate comprises an aluminum alloy having a thickness of about 8–20 mils (203–508 microns).

5. The process of claim 1, wherein said adhesive layer comprises a polymer selected from the group consisting of polyesters, polyolefins, polyamides, polycarbonates, polyvinyl chlorides and mixtures thereof.

6. The process of claim 1, wherein step (b) comprises extrusion coating onto said substrate an adhesive layer comprising polyethylene terephthalate.

7. The process of claim 6, wherein said adhesive layer has a thickness of about 0.25–2 mils (6–51 microns).

8. The process of claim 1, wherein said particles have an average particle size of about 0.5–20 microns.

9. The process of claim 1, wherein said particles have an average particle size of about 1–10 microns.

10. The process of claim 1 wherein said particles comprise alumina particles, and further comprising:

(e) providing a sealant coating over said alumina particles.

11. The process of claim 1 further comprising:

(f) coating a photosensitive layer over said particles.

12. The process of claim 1 further comprising:

(g) cooling said sheet material, thereby to trap said mineral or metal particles in said adhesive layer.

13. The process of claim 1 wherein said adhesive layer comprises polyethylene terephthalate and step (c) comprises maintaining said adhesive layer within about 10° F. above or below its melting point.

14. The process of claim 13 wherein said particles comprise alumina particles having an average particle size of about 1–10 microns.

15. The process of claim 14 further comprising:
   (e) providing a sealant coating over said alumina particles.

16. The process of claim 13 further comprising:
   (f) coating a photosensitive layer over said particles.

17. A process for making lithographic sheet material comprising:
   (a) providing a substrate comprising an aluminum alloy or steel sheet having a thickness of about 5–30 mils (127–762 microns);
   (b) coating said substrate with a adhesive layer comprising a thermoplastic polymer selected from the group consisting of polyesters, polyolefins, acrylics, polyamides, polycarbonates, polyvinyl chlorides and mixtures thereof;
   (c) maintaining said adhesive layer at one or more temperatures within about 10° F. above or below its melting point; and
   (d) while maintaining said adhesive layer at said one or more temperatures, adhering to said adhesive layer a particle layer comprising a plurality of alumina, silica or titanium oxide particles, said particles having an average particle size of less than about 30 microns and less than the thickness of said adhesive layer.

18. The process of claim 17 wherein said substrate comprises an aluminum alloy sheet having a thickness of about 8–20 mils (203–508 microns) and said adhesive layer has a thickness of about 0.25–2 mils (6–51 microns).

19. The process of claim 18 wherein said adhesive layer comprises polyethylene terephthalate and said particles comprise alumina particles.

* * * * *